(12) United States Patent
Yang et al.

(10) Patent No.: US 10,756,206 B2
(45) Date of Patent: Aug. 25, 2020

(54) HIGH POWER COMPOUND SEMICONDUCTOR FIELD EFFECT TRANSISTOR DEVICES WITH LOW DOPED DRAIN

(71) Applicant: QUALCOMM Incorporated, San Diego, CA (US)

(72) Inventors: Bin Yang, San Diego, CA (US); Xia Li, San Diego, CA (US); Gengming Tao, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 95 days.

(21) Appl. No.: 15/645,188

(22) Filed: Jul. 10, 2017

(65) Prior Publication Data
US 2019/0013398 A1 Jan. 10, 2019

(51) Int. Cl.
*H01L 29/66* (2006.01)
*H01L 29/778* (2006.01)
(Continued)

(52) U.S. Cl.
CPC ........ *H01L 29/7785* (2013.01); *H01L 21/743* (2013.01); *H01L 21/746* (2013.01); *H01L 23/66* (2013.01); *H01L 29/0843* (2013.01); *H01L 29/1075* (2013.01); *H01L 29/205* (2013.01); *H01L 29/66462* (2013.01); *H01L 29/7787* (2013.01); *H01L 2223/6677* (2013.01); *H03F 3/189* (2013.01); *H03F 3/245* (2013.01); *H03F 2200/171* (2013.01); *H03F 2200/294* (2013.01); *H03F 2200/336* (2013.01);
(Continued)

(58) Field of Classification Search
CPC . H01L 27/0274; H01L 29/402; H01L 29/432; H01L 29/66462; H01L 29/7785; H01L 27/12; H01L 27/1225; H01L 27/124; H01L 27/3262; H01L 27/3272; H01L 27/3276; H01L 29/78678; H01L 29/7869; H01L 51/0097; H01L 51/5012
See application file for complete search history.

(56) References Cited

U.S. PATENT DOCUMENTS

| 6,144,048 A | 11/2000 | Suemitsu et al. |
|---|---|---|
| 8,288,260 B1 | 10/2012 | Hanson |

(Continued)

FOREIGN PATENT DOCUMENTS

| WO | 2006025971 A1 | 3/2006 |
|---|---|---|
| WO | 2016097576 A1 | 6/2016 |

OTHER PUBLICATIONS

International Search Report and Written Opinion—PCT/US2018/034155—ISA/EPO—dated Nov. 27, 2018.

*Primary Examiner* — Meiya Li
(74) *Attorney, Agent, or Firm* — Seyfarth Shaw LLP

(57) ABSTRACT

A compound semiconductor field effect transistor may include a channel layer. The compound semiconductor transistor may also include a multi-layer epitaxial barrier layer on the channel layer. The channel layer may be on a doped buffer layer or on a first un-doped buffer layer. The compound semiconductor field effect transistor may further include a gate. The gate may be on a first tier of the multi-layer epitaxial barrier layer, and through a space between portions of a second tier of the multi-layer epitaxial barrier layer.

24 Claims, 17 Drawing Sheets

(51) Int. Cl.
  *H01L 29/10*   (2006.01)
  *H01L 29/205*  (2006.01)
  *H01L 21/74*   (2006.01)
  *H01L 23/66*   (2006.01)
  *H01L 29/08*   (2006.01)
  *H03F 3/24*    (2006.01)
  *H03F 3/189*   (2006.01)
  *H04W 88/02*   (2009.01)

(52) U.S. Cl.
  CPC .. *H03F 2200/411* (2013.01); *H03F 2200/451* (2013.01); *H04W 88/02* (2013.01)

(56) References Cited

U.S. PATENT DOCUMENTS

| | | |
|---|---|---|
| 8,816,396 B2 | 8/2014 | Hwang et al. |
| 8,936,976 B2 | 1/2015 | Radosavljevic et al. |
| 2007/0029640 A1* | 2/2007 | Isono ................ H01L 29/7787 257/615 |
| 2008/0054300 A1* | 3/2008 | Nikkel ............... H01L 29/1029 257/192 |
| 2010/0032683 A1 | 2/2010 | Ikeda et al. |
| 2010/0140672 A1 | 6/2010 | Aoike et al. |
| 2012/0068772 A1* | 3/2012 | Murad ................. H01L 29/402 330/296 |
| 2013/0082305 A1 | 4/2013 | Yuan et al. |
| 2014/0036471 A1* | 2/2014 | Yuen ...................... H05K 7/02 361/813 |
| 2015/0263116 A1 | 9/2015 | Qiu et al. |
| 2016/0315179 A1 | 10/2016 | Nishimori et al. |
| 2017/0033187 A1 | 2/2017 | Rajan et al. |

* cited by examiner

HIGH POWER COMPOUND SEMICONDUCTOR FIELD EFFECT TRANSISTOR DEVICES WITH LOW DOPED DRAIN

BACKGROUND

Field

The present disclosure relates generally to wireless communication systems, and more specifically, to high power compound semiconductor (e.g., III-V) field effect transistor (FET) devices with a low doped drain (LDD).

Background

A wireless device (e.g., a cellular phone or a smartphone) or a base station in a wireless communication system may include a radio frequency (RF) transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to the base station or to the wireless device. For data reception, the receive section may obtain a received RF signal via the antenna and may amplify and process the received RF signal to recover data sent by the base station or the wireless device.

The transmit section of the mobile RF transceiver may amplify and transmit a communication signal. The transmit section may include one or more circuits for amplifying and transmitting the communication signal. The amplifier circuits may include one or more amplifier stages that may have one or more driver stages and one or more power amplifier stages. Each of the amplifier stages includes one or more transistors configured in various ways to amplify the communication signal. The transistors configured to amplify the communication signal are generally selected to operate at substantially higher breakdown voltages for supporting communication from the base station.

Compound semiconductor materials (e.g., column III and column V (III-V) or column II and column IV (II-VI such as GaAs and InP)) have higher bandgap and higher mobility, and should therefore have higher breakdown and power-added efficiency (PAE), which is desirable for power amplifiers. However, due to implant damage on a substrate of the compound semiconductor (e.g., III-V substrate) that causes formation defects, higher breakdown voltages in transistors of the compound semiconductor material (e.g., III-V field effect transistors (FETs) have not yet been achieved, which make it difficult to meet the power specifications for communication.

SUMMARY

A compound semiconductor field effect transistor may include a channel layer. The compound semiconductor field effect transistor may also include a multi-layer epitaxial barrier layer on the channel layer. The channel layer may be on a doped buffer layer or on a first un-doped buffer layer. The compound semiconductor transistor may further include a gate. The gate may be on a first tier of the multi-layer epitaxial barrier layer, and through a space between portions of a second tier of the multi-layer epitaxial barrier layer.

A method of making a compound semiconductor field effect transistor (FET) may include epitaxially growing a doped buffer layer or a first un-doped buffer layer. The method may include forming a multi-layer epitaxial barrier layer on a channel layer. The channel layer may be on the doped buffer layer or on the first un-doped buffer layer. The method may also include etching the multi-layer epitaxial barrier layer to expose a first tier of the multi-layer epitaxial barrier layer. The method may further include forming a gate on the first tier of the multi-layer epitaxial barrier layer, and through a space between portions of a second tier of the multi-layer epitaxial barrier layer.

A radio frequency (RF) front end module may include a chip. The chip may include a compound semiconductor field effect transistor, comprising a channel layer, and a multi-layer epitaxial barrier layer on the channel layer. The channel layer may be on a doped buffer layer or on a first un-doped buffer layer. The chip may also include a gate on a first tier of the multi-layer epitaxial barrier layer, and through a space between portions of a second tier of the multi-layer epitaxial barrier layer. The RF front end module may also include an antenna coupled to an output of the chip.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
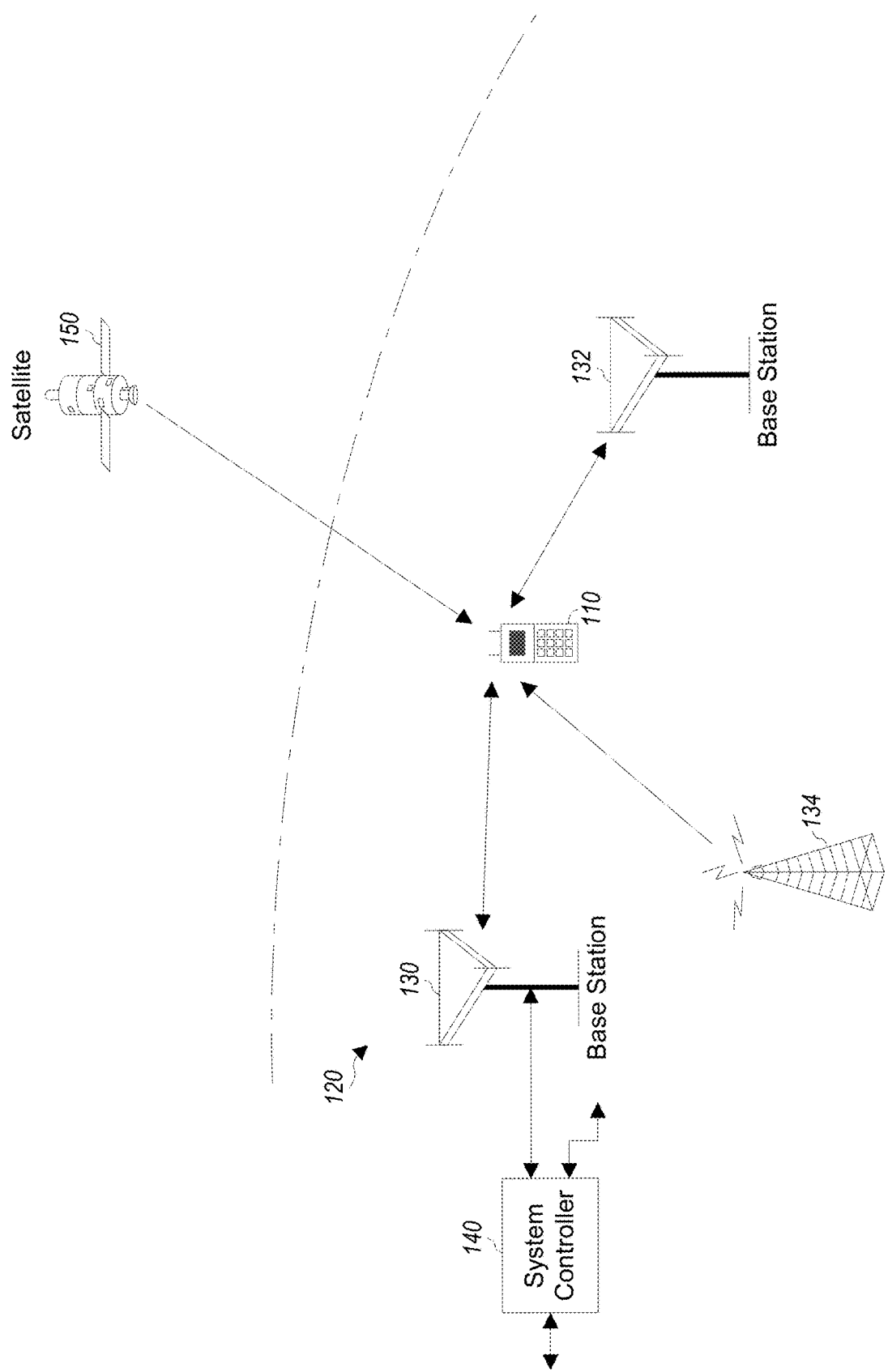
FIG. 1 shows a wireless device communicating with a wireless system, according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

Conventional compound semiconductor materials (e.g., III-V field effect transistors (FETs) or a II-VI field effect transistors (FETs)) do not include a low-doped-drain (LDD), and therefore suffer from lower breakdown voltages short of their ultimate potential. For example, these compound semiconductor materials may include, but are not limited to, gallium arsenide (GaAs), indium phosphide (InP), gallium nitride (GaN), gallium stibium (GaSb), gallium phosphide (GaP), indium gallium arsenide (InGaAs), aluminum gallium arsenide (AlGaAs), indium gallium phosphide (InGaP), aluminum gallium phosphide (AsGaP), aluminum gallium stibium (AlGaSb), indium gallium stibium (InGaSb), indium gallium nitride (InGaN), aluminum gallium nitride (AlGaN), indium gallium arsenide phosphide (InGaAsP), indium gallium arsenide stibium (InGaAsSb), or indium gallium arsenide:nitride (InGaAs:N). These are exemplary only, and other materials are possible.

Because of the lack of a low doped drain, the compound semiconductor materials (e.g., gallium arsenide (GaAs) and indium phosphide (InP) FETs) are limited to high-speed applications. This follows because III-V devices have better frequency performance. However, III-V devices cannot sustain high voltages. For example, the breakdown voltage of III-V devices can be as low as 15 V. Thus, no power amplifiers (PAs) are currently made for base stations with GaAs or InP. In contrast, even though silicon (Si) has a smaller bandgap, a silicon laterally diffused metal oxide semiconductor (LDMOS) may provide 50 V-100 V, or higher, breakdown voltages, and is predominantly used in power amplifiers for wireless base stations.

The conventional silicon LDMOS can achieve high breakdown voltages because the low doped drains can be implanted on the drain in accordance with multiple implanting steps. Multiple implanting steps in compound semiconductor devices, such as a III-V device, is not an option. Instead every layer in a III-V device from source to drain is uniform. For example, the doped barrier, the channel, the buffer, and the substrate are all uniform. No implanting is allowed for high mobility III-V transistors due to defect formation or channel mobility degradation concerns. This follows because III-V device material can be grown and etched back but cannot undergo multiple implantations to form the LDD.

In principle, GaAs and InP have higher bandgap and higher mobility, and should therefore have higher breakdown and power-added efficiency (PAE), which is very desirable for PAs. However, due to implant damage on the III-V substrate that causes formation defects, LDD in III-V FETs has not yet been achieved. Conventional gallium nitride (GaN) high-electron-mobility transistor (HEMT) devices may be fabricated with high breakdown and high power due to much lower impact ionization as a result of an intrinsically higher bandgap. However, because the conventional GaN HEMT does not have LDD, the currently achieved breakdown voltage is far below the potential limit that a GaN HEMT could potentially achieve.

Therefore, a desire exists for a high power compound semiconductor FET device. Aspects of the present disclosure are directed to a high power compound semiconductor FET device with a novel LDD structure for GaAs, InP, and GaN HEMT or pseudomorphic high-electron-mobility transistor (pHEMT) devices. The LDD structure may include a novel epitaxial layer design, which is achieved through novel processing, to significantly increase the breakdown voltages in a compound semiconductor FET.

In one aspect of the disclosure, a compound semiconductor field effect transistor includes a multi-layer epitaxial barrier layer (e.g., composite, multi-layer epitaxial barrier layer) on a channel layer. The compound semiconductor transistor may include a high-electron-mobility transistor (HEMT) or a pseudomorphic high-electron-mobility transistor (pHEMT). The composite multi-layer epitaxial barrier layer may include a first tier and a second tier. A gate is provided on the first tier of the composite, multi-layer epitaxial barrier layer through a space between portions of the second tier of the multi-layer epitaxial barrier layer. The compound semiconductor field effect transistor further includes a body contact electrically coupled to the doped buffer layer. The doped buffer layer may be a p-type doped buffer layer. An etch stop layer may be provided on the doped buffer layer where the etch stop layer is between the doped buffer layer and the channel layer.

In one aspect of the disclosure, a thickness of the composite multi-layer epitaxial barrier layer increases in steps as a distance from the gate increases. For example, the multi-layer epitaxial barrier layer may include a third tier with an increased distance from the gate, that results in an increased thickness of the composite multi-layer epitaxial barrier layer with respect to the third tier. An etch stop layer may be provided between each of the tiers. In some aspects, a distance between the gate and a source region of the compound semiconductor field effect transistor is less than a distance between the gate and a drain region.

Advantages include an improvement in compound semiconductor FET breakdown voltages by a multiple of 2×-10×. The LDD structure may also be fabricated in a compound semiconductor FET without any implant damage concerns. The process leverages conventional compound semiconductor process technology, so no additional equipment or special tools are used. The implementation is low-cost and applicable to a wide variety of telecommunication products.

FIG. 1 shows a wireless device 110 communicating with a wireless communication system 120. The wireless communication system 120 may be a 5G system, long term evolution (LTE) system, a code division multiple access (CDMA) system, a global system for mobile communications (GSM) system, a wireless local area network (WLAN)

system, or some other wireless system. A CDMA system may implement wideband CDMA (WCDMA), time division synchronous CDMA (TD-SCDMA), CDMA2000, or some other version of CDMA. For simplicity, FIG. 1 shows the wireless communication system 120 including two base stations 130 and 132 and one system controller 140. In general, a wireless system may include any number of base stations and any number of network entities.

A wireless device 110 may also be referred to as a user equipment (UE), a mobile station, a terminal, an access terminal, a subscriber unit, a station, etc. The wireless device 110 may be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS (Universal Mobile Telecommunications System) bands and are listed in Third Generation Partnership Project Technical Specification 3GPP TS 36.101. The wireless device 110 may be configured with up to 5 carriers in one or two bands in LTE Release 11.

Figure 2:
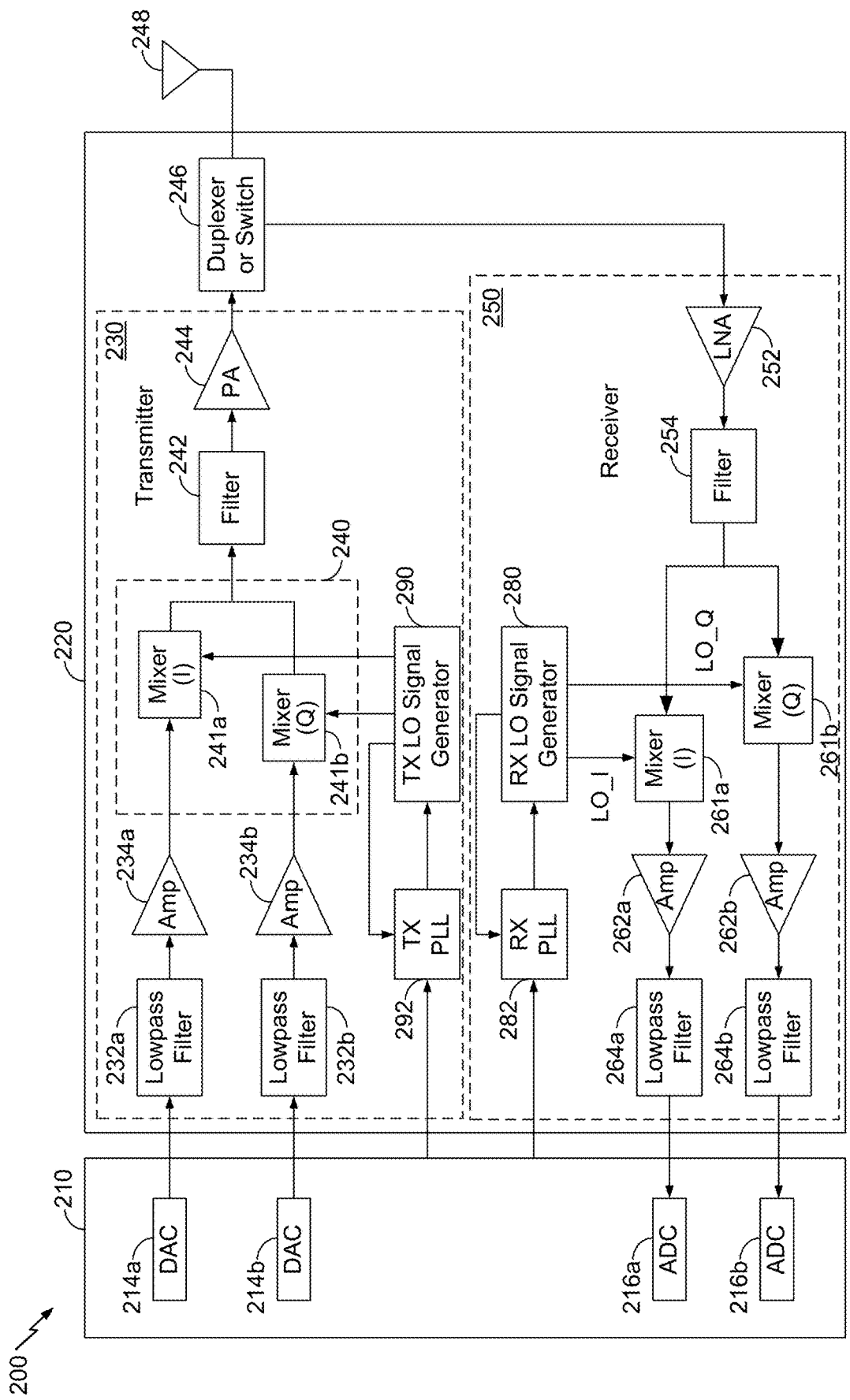
FIG. 2 shows a block diagram of the wireless device in FIG. 1, according to an aspect of the present disclosure.

FIG. 2 shows a block diagram of an exemplary design of a wireless device 200, such as the base station 130 shown in FIG. 1. FIG. 2 shows an example of a transceiver 220, which may be a wireless transceiver (WTR). In general, the conditioning of the signals in a transmitter 230 and a receiver 250 may be performed by one or more stages of amplifier(s), filter(s), upconverters, downconverters, and the like. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, the wireless device 200 generally includes the transceiver 220 and a data processor 210. The data processor 210 may include a memory (not shown) to store data and program codes, and may generally include analog and digital processing elements. The transceiver 220 may include the transmitter 230 and receiver 250 that support bi-directional communication. In general, the wireless device 200 may include any number of transmitters and/or receivers for any number of communication systems and frequency bands. All or a portion of the transceiver 220 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and then from intermediate frequency to baseband in another stage for a receiver. In the direct-conversion architecture, a signal is frequency converted between radio frequency and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital-to-analog-converters (DACs) 214a and 214b for converting digital signals generated by the data processor 210 into the in-phase (I) and quadrature (Q) analog output signals (e.g., I and Q output currents) for further processing.

Within the transmitter 230, lowpass filters 232a and 232b filter the in-phase (I) and quadrature (Q) analog transmit signals, respectively, to remove undesired images caused by the prior digital-to-analog conversion. Amplifiers (Amp) 234a and 234b amplify the signals from lowpass filters 232a and 232b, respectively, and provide in-phase (I) and quadrature (Q) baseband signals. An upconverter 240 upconverts the in-phase (I) and quadrature (Q) baseband signals with in-phase (I) and quadrature (Q) transmit (TX) local oscillator (LO) signals from a TX LO signal generator 290 to provide an upconverted signal. A filter 242 filters the upconverted signal to remove undesired images caused by the frequency upconversion as well as noise in a receive frequency band. A power amplifier (PA) 244 amplifies the signal from the filter 242 to obtain the desired output power level and provides a transmit radio frequency signal. The transmit radio frequency signal is routed through a duplexer/switch 246 and transmitted via an antenna 248.

In a receive path, the antenna 248 receives communication signals and provides a received radio frequency (RF) signal, which is routed through the duplexer/switch 246 and provided to a low noise amplifier (LNA) 252. The duplexer/switch 246 is designed to operate with a specific receive (RX) to transmit (TX) (RX-to-TX) duplexer frequency separation, such that RX signals are isolated from TX signals. The received RF signal is amplified by the LNA 252 and filtered by a filter 254 to obtain a desired RF input signal. Downconversion mixers 261a and 261b mix the output of the filter 254 with in-phase (I) and quadrature (Q) receive (RX) LO signals (i.e., LO_I and LO_Q) from an RX LO signal generator 280 to generate in-phase (I) and quadrature (Q) baseband signals. The in-phase (I) and quadrature (Q) baseband signals are amplified by amplifiers 262a and 262b and further filtered by lowpass filters 264a and 264b to obtain in-phase (I) and quadrature (Q) analog input signals, which are provided to the data processor 210. In the exemplary configuration shown, the data processor 210 includes analog-to-digital-converters (ADCs) 216a and 216b for converting the analog input signals into digital signals for further processing by the data processor 210.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

A power amplifier 244 may include one or more stages having, for example, driver stages, power amplifier stages, or other components, that can be configured to amplify a communication signal on one or more frequencies, in one or more frequency bands, and at one or more power levels. The transistors configured to amplify the communication signal, however, are generally selected to operate at substantially higher frequencies, further complicating thermal power specifications. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs specifying high power efficiency including RF power amplifiers in mobile RF transceivers.

Figure 3:
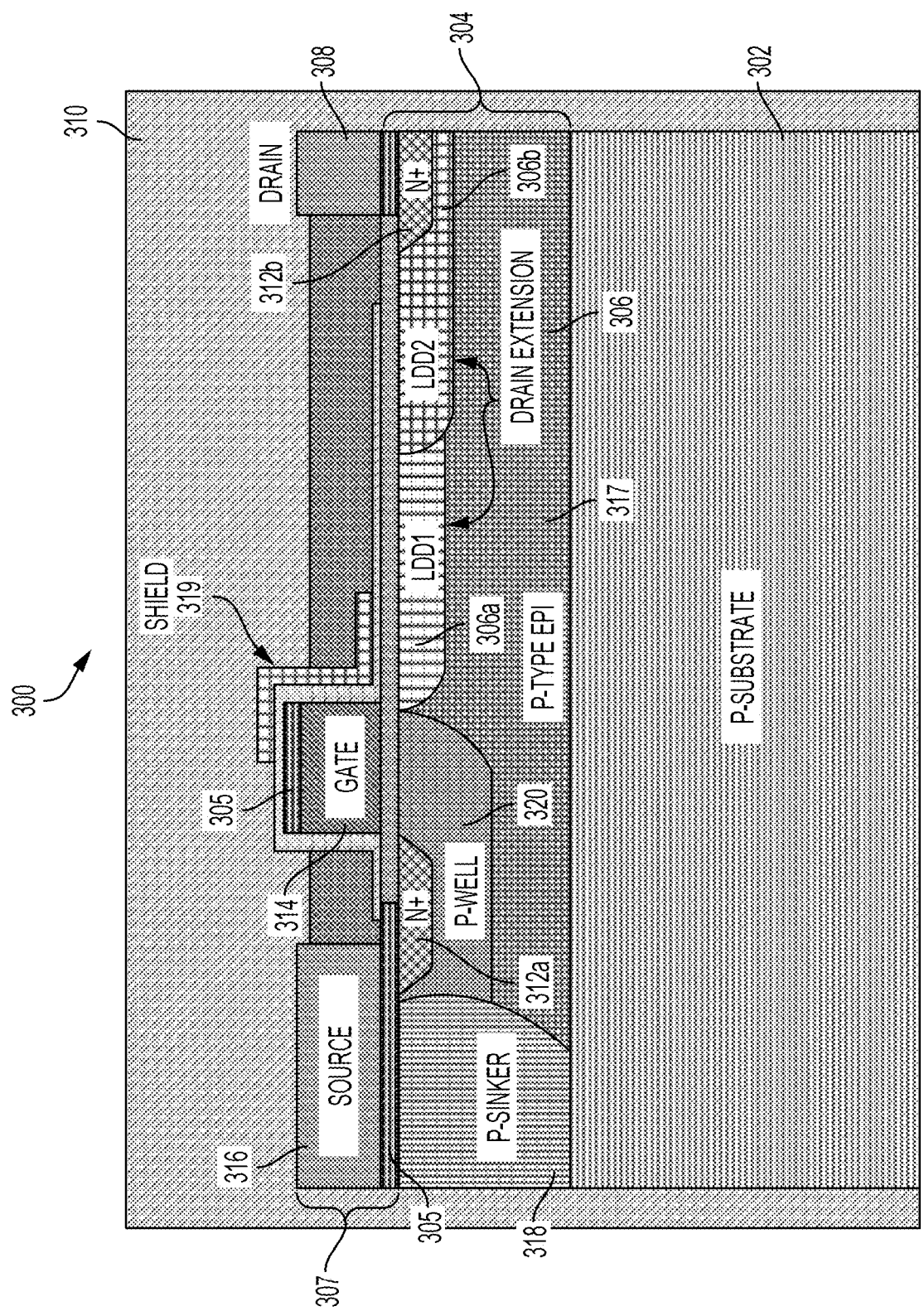
FIG. 3 is an example of a cross-sectional view of a laterally diffused metal oxide semiconductor.

FIG. 3 is an example of a cross-sectional view of a laterally diffused metal oxide semiconductor (LDMOS) device 300. The LDMOS device 300 utilizes a multiple-level metal fabrication process to form an interconnection between regions of differing conductivity types (e.g., n-type and p-type) in a source region of the LDMOS device 300. The LDMOS device 300 is formed on a semiconductor substrate 302. The semiconductor substrate 302 is a p-type substrate and is formed of silicon. The LDMOS device includes an n-type source region 312a and an n-type drain region 312b formed in a region 304 on the semiconductor substrate 302.

The LDMOS device 300 further includes a gate 314 formed above a channel region 320 or p-type well of the LDMOS device 300. The channel region 320 is at least partially formed between the source region 312a and the drain region 312b. The source region 312a and the drain region 312b are n-type regions. A drift region is generally formed in the region 304 of the LDMOS device, which may comprise a first lightly-doped drain (LDD) region (LDD1) 306a and a second LDD region (LDD2) 306b formed between the channel region 320 and drain region 312b. The LDMOS device 300 also includes a non-uniform p-type region 318 formed in the region 304 connecting the p-type substrate 302 to active regions (e.g., region 307) of the LDMOS device 300 via one or more trench sinkers (not shown) formed through the region 304. The trench sinkers provide a low resistance path between the semiconductor substrate 302 and the active region 307. The LDMOS device 300 also includes another non-uniform p-type region 317 formed in the region 304.

The LDMOS device 300 includes a drain contact 308 electrically connected to the drain region 312b, and a source contact 316 electrically connected to the source region 312a. A conductive (e.g., metal) layer 305 is formed on at least a portion of the source region 312a and p-type region 318 for electrically connecting the n-type source region 312a and p-type region 318. The conductive layer 305 may also be formed over at least a portion of the gate 314 for shielding purposes. A shield 319 may be additionally formed to shield the gate 314. An encapsulation layer 310 is generally formed on at least a portion of outer surfaces of the LDMOS device 300 to protect the LDMOS device 300.

The desirable characteristics of the LDMOS are high frequency performance, a low on-state voltage drop, and a high blocking voltage. However, an LDMOS cannot achieve higher breakdown and power-added efficiency (PAE), which are very desirable for power amplifiers.

Figure 4:
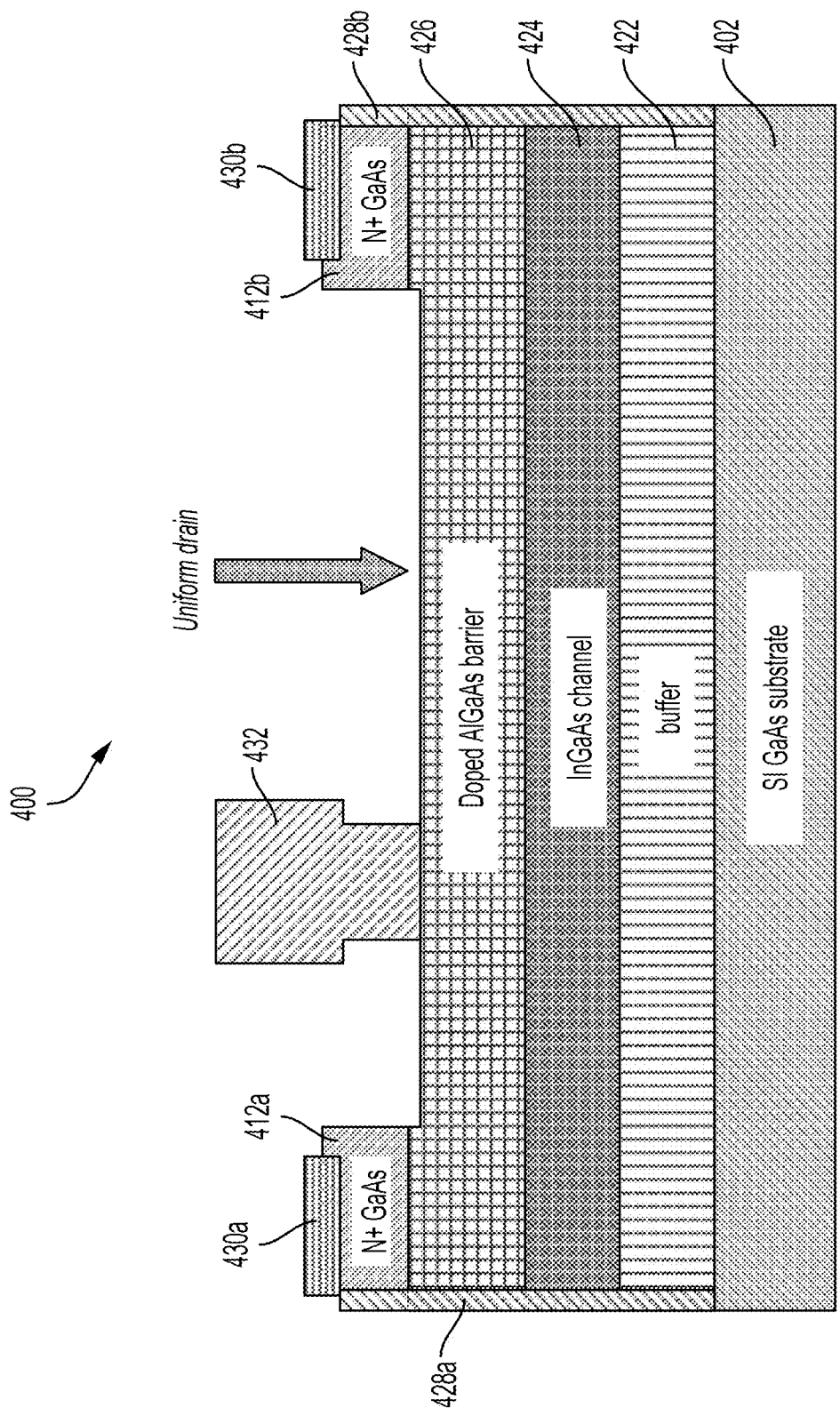
FIG. 4 shows a cross-sectional view of an exemplary compound semiconductor material device.

FIG. 4 shows a cross-sectional view of an exemplary compound semiconductor material device 400. The compound semiconductor material device 400 can include one or more group III elements and one or more group V elements. For example, the III-V compound semiconductor material device 400 may be in the form of a III-Nitride (III-N) semiconductor, which includes nitrogen and one or more group III elements such as aluminum (Al), gallium (Ga), indium (In), and boron (B). The III-Nitride semiconductor may also include but not limited to, any of its alloys, such as aluminum gallium nitride (AlGaN), indium gallium nitride (InGaN), aluminum indium gallium nitride (AlInGaN), gallium arsenide phosphide nitride (GaAsPN), and any other variants.

The compound semiconductor material device 400 includes a substrate (e.g., GaAs substrate) 402, and a buffer layer 422 on the substrate 402. In addition, the compound semiconductor material device 400 includes a channel layer 424 (e.g., InGaAs channel layer) between the buffer layer 422 and a doped barrier layer 426. The doped barrier layer 426 may include a doped AlGaAs doped barrier layer. The compound semiconductor material device 400 also includes a drain electrode 412b (e.g., n-type GaAs drain electrode), a source electrode 412a (e.g., n-type GaAs source electrode), and a gate electrode 432. An ohmic contact 430a may be provided on the source electrode 412a and an ohmic contact 430b may be provided on the drain electrode 412b. The gate electrode 432 may correspond to a Schottky gate configured to make Schottky contact with the doped barrier layer 426, or may correspond to an insulated gate configured to couple capacitively to the doped barrier layer 426. Isolation layers 428a and 428b are provided on the compound semiconductor material device 400.

The compound semiconductor material device 400 should have higher breakdown and power-added efficiency (PAE), which are very desirable for power amplifiers. However, due to implant damage on the substrate 402 that causes formation defects, higher breakdown voltages in transistors of the III-V compound semiconductor material device 400 are not achieved, which makes it difficult to meet the power specifications for communication.

Figure 5:
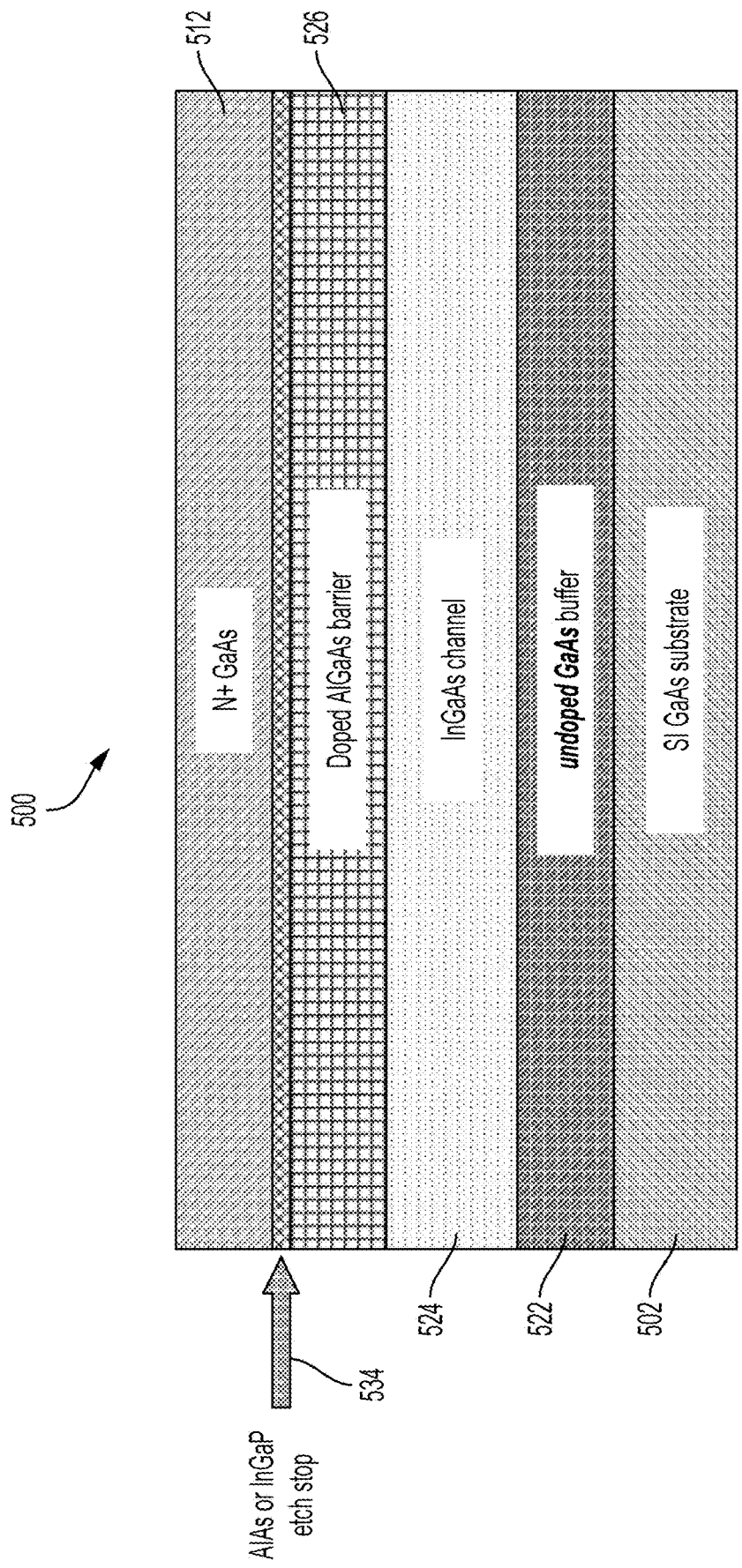
FIG. 5 illustrates a portion of a compound semiconductor field effect transistor with a single-layer epitaxial barrier layer.

FIG. 5 illustrates a portion of a compound semiconductor field effect transistor 500 with a single-layer epitaxial barrier layer. This arrangement shows a compound semiconductor substrate 502 supporting an un-doped buffer layer 522, a channel 524 (e.g., a channel layer), and a doped barrier layer 526, which are epitaxially grown. An etch stop layer 534 (e.g., aluminum arsenide (AlAs) or indium gallium phosphide (InGaP)) is shown on the doped barrier layer 526, supporting a doped (e.g., N+ GaAs) compound semiconductor active layer 512. In one aspect of the disclosure, the substrate may be a p-type substrate.

FIGS. 6A, 6B, 7, 8, 9, 10, 11, 12, 13, and 14 illustrate formation of a compound semiconductor field effect transistor according to aspects of the present disclosure. The compound semiconductor transistor of FIGS. 6A, 6B, 7, 8, 9, 10, 11, 12, 13, and 14 may be a high-electron-mobility transistor (HEMT) or a pseudomorphic high-electron-mobility transistor (pHEMT), for example.

Figure 6A:
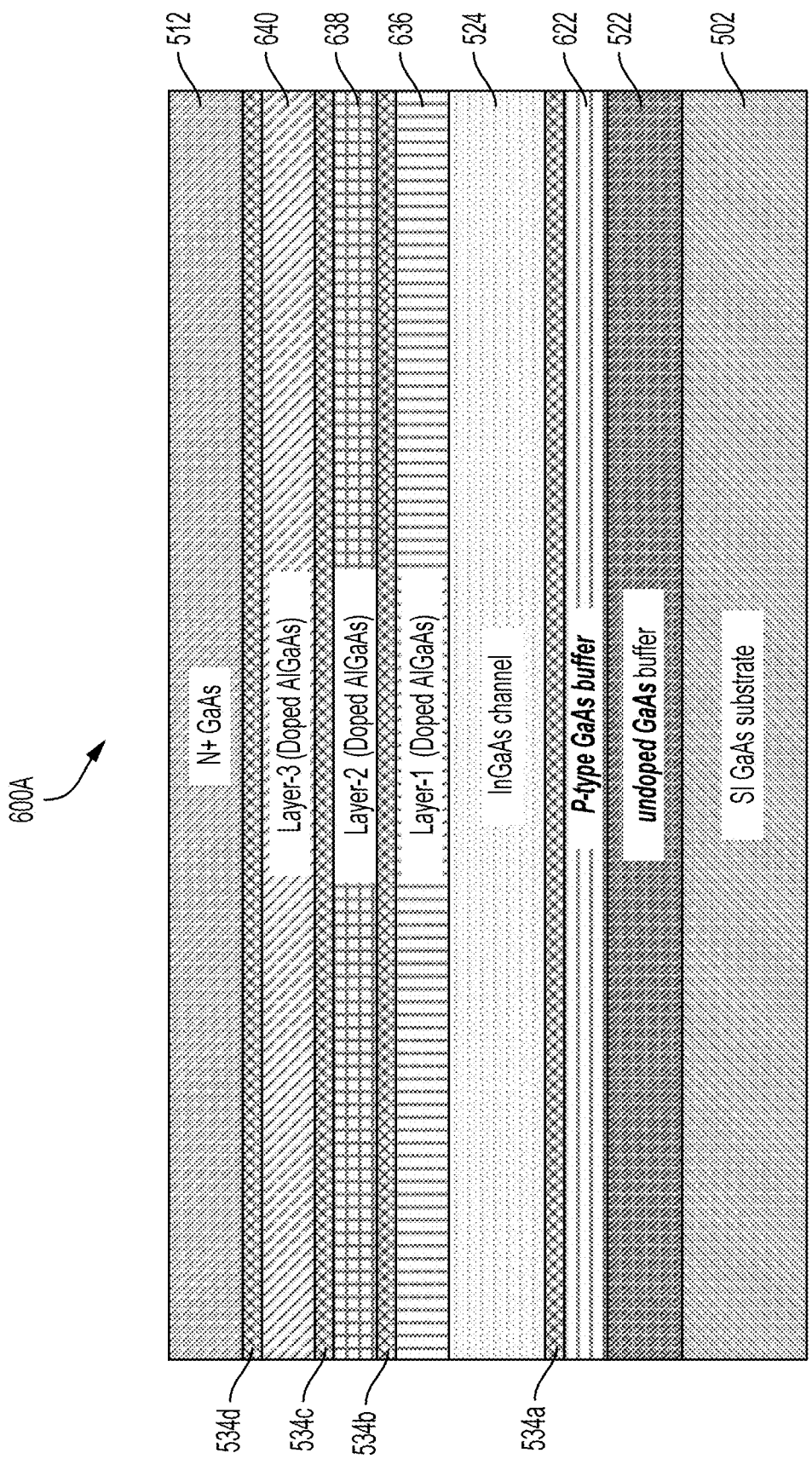
FIGS. 6A, 6B and 7-14 illustrate formation of a compound semiconductor field effect transistor according to aspects of the present disclosure.

FIG. 6A illustrates a compound semiconductor field effect transistor 600A with a multi-layer epitaxial barrier layer (e.g., composite barrier layers) according to aspects of the present disclosure. For illustrative purposes, some of the labelling and numbering of the layers and features of FIG. 6A are similar to those of FIG. 5. For example, FIG. 6A shows the compound semiconductor substrate 502 supporting an un-doped buffer layer 522 and a channel 524 (e.g., a channel layer). However, the buffer layer of FIG. 6A is a multi-layer epitaxial barrier layer rather than a single barrier layer 526. The multi-layer epitaxial barrier layer may be achieved with an innovative epitaxial design and etch process. For example, the multi-layer epitaxial barrier layer includes a first epitaxial barrier layer 636 (or tier 1), a second epitaxial barrier layer 638 (or tier 2), and a third epitaxial barrier layer 640 (or tier 3).

Each of the first epitaxial barrier layer 636, the second epitaxial barrier layer 638, and the third epitaxial barrier layer 640 may have different levels or concentrations of dopants (e.g., n-type dopant) based on a desired breakdown voltage for the compound semiconductor material. The concentration or composition of the dopants is based on an application and a length of the doped layers. For example, longer low doped drains are specified to have higher breakdown voltages. While the introduction of the epitaxial barrier layers reduces a distance between the source and the drain thereby reducing efficiency (e.g., frequency degradation), the efficiency reduction is offset by the improved breakdown voltage of the compound semiconductor field effect transistor. Aspects of the present disclosure improve the design to realize the benefits of the improved breakdown voltage. For example, the source is specified to be as close to the gate as possible without causing a short. A dielectric spacer may be introduced to separate the source from the gate to prevent the short.

For example, the first, second, and third epitaxial barrier layers 636, 638, and 640 may be AlGaAs doped with silicon (Si) and aluminum (Al). The first, second, and third epitaxial barrier layers 636, 638, and 640 may include a doping concentration of (~1E11 cm$^{-2}$ to 1E13 cm$^{-2}$), ~1 nm-20 nm and aluminum composition of ~10% to 80%. In one aspect of the disclosure, the doping concentration for layers 636/638/640 are respectively 3E12 cm$^{-2}$/1E12 cm$^{-2}$/1E12 cm$^{-2}$).

Additionally, FIG. 6A illustrates a second etch stop layer 534b on the first epitaxial barrier layer 636, a third etch stop layer 534c on the second epitaxial barrier layer 638, and a fourth etch stop layer 534d on the third epitaxial barrier layer 640. Furthermore, FIG. 6A illustrates a doped buffer layer (e.g., P-type) 622 on the un-doped buffer layer 522. The doped buffer layer 622 is a uniform doped buffer layer. This follows because the III-V device is formed with uniform layers. A first etch stop layer 534a is shown on the doped buffer layer 622, supporting the channel layer 524. The doped (e.g., N+ GaAs) compound semiconductor active layer 512 is on the fourth etch stop layer 534d.

Figure 6B:
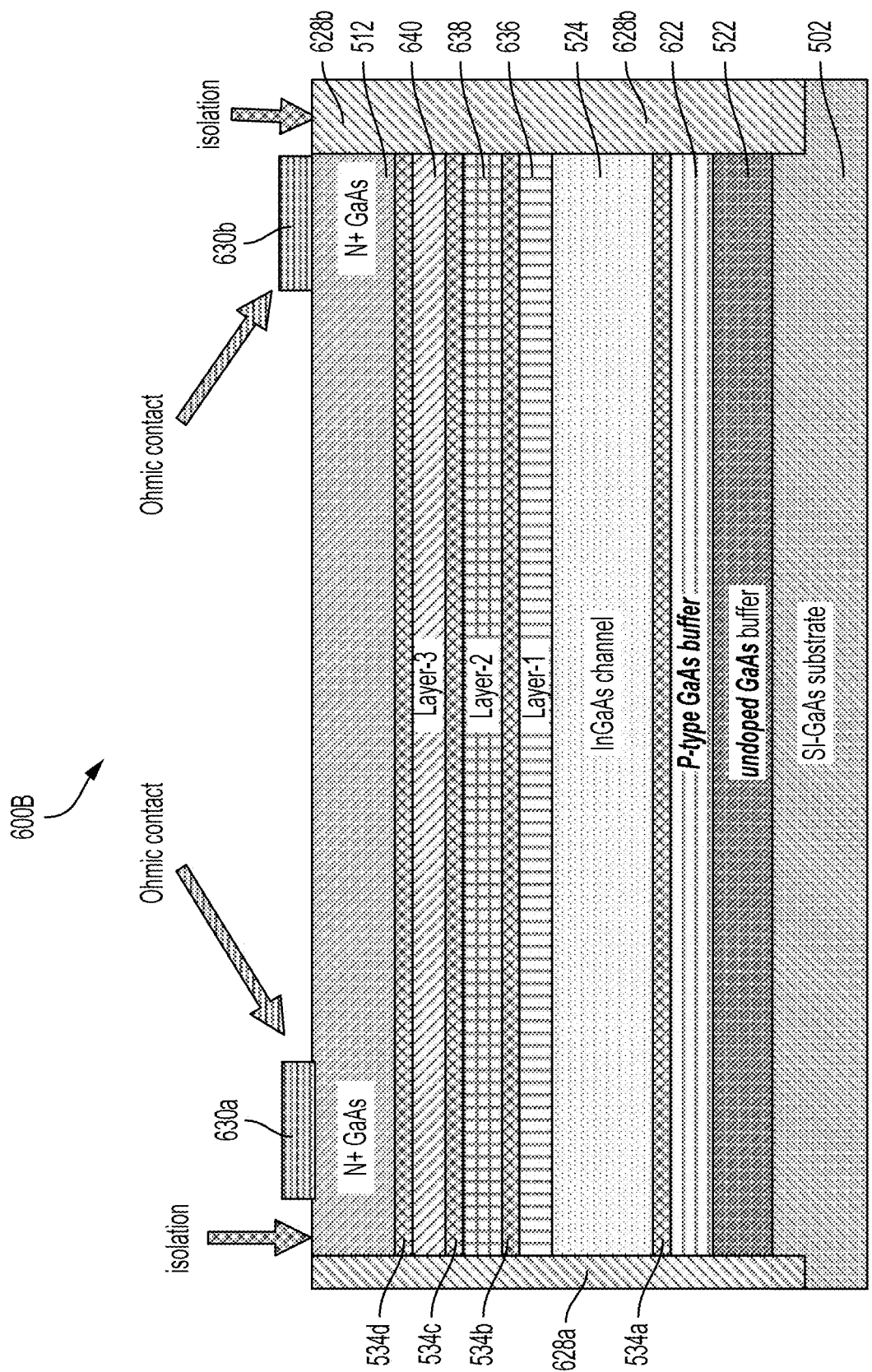

FIG. 6B illustrates a compound semiconductor field effect transistor 600B with isolation and ohmic contacts according to aspects of the present disclosure. For illustrative purposes, some of the labelling and numbering of the layers and features of FIG. 6B are similar to those of FIG. 6A. In FIG. 6B isolation layers 628a and 628b are provided on the compound semiconductor field effect transistor 600B. The isolation layers may be fabricated in accordance with an implant process. For example, an implant process intentionally damages portions of the layers of the compound semiconductor field effect transistor 600B. When a defect is substantial, carriers of the layers of the compound semiconductor field effect transistor 600B get trapped and become an insulator, which correspond to the isolation layers 628a and 628b of the compound semiconductor field effect transistor 600B. In contrast, when silicon is damaged (e.g., with respect to the LDMOS implementation), it can recover and therefore does not become an insulator. In addition, ohmic contacts 630a and 630b are provided on the doped compound semiconductor active layer 512.

Figure 7:
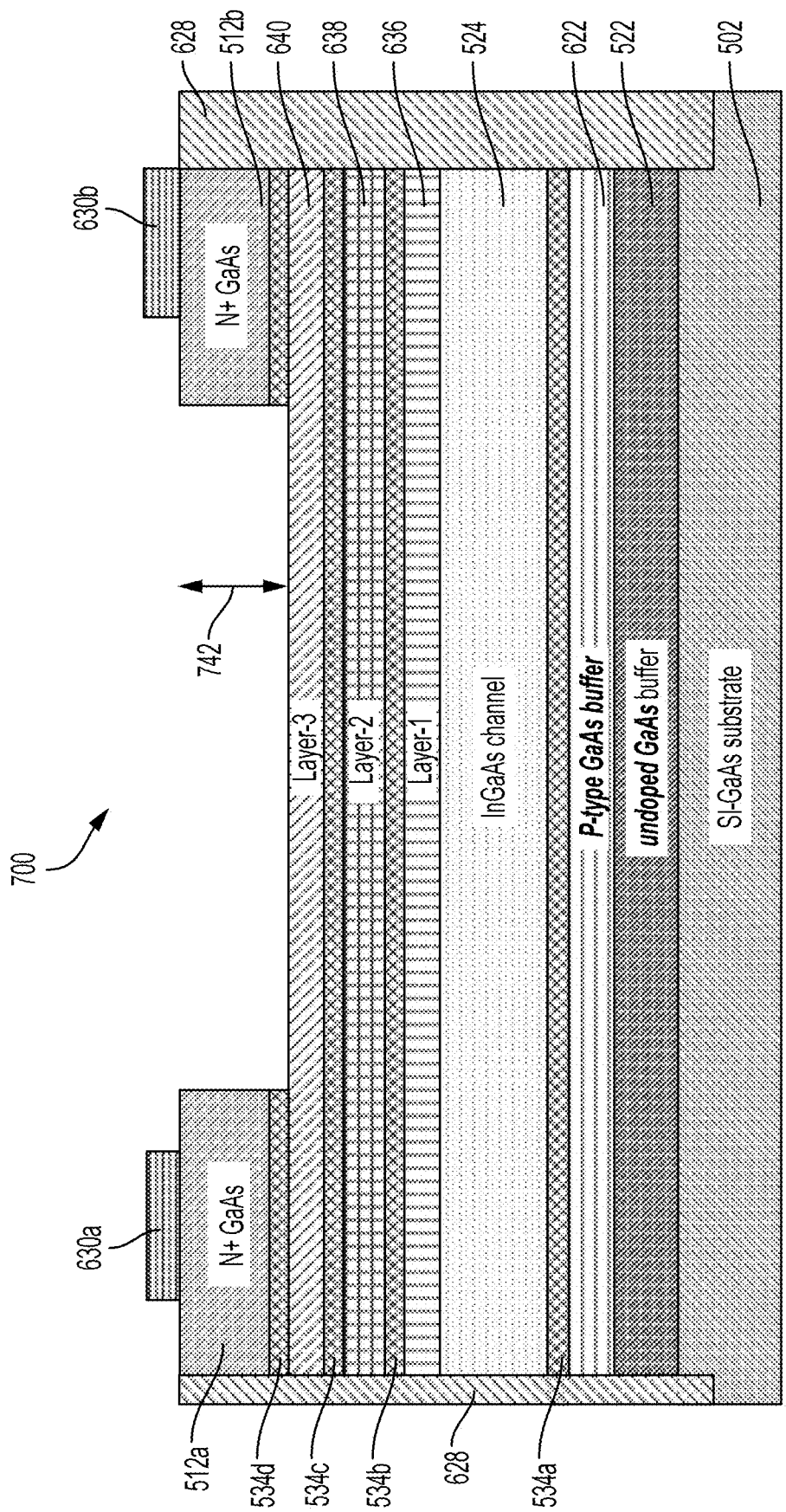

FIG. 7 illustrates a compound semiconductor field effect transistor 700 in which a portion of the doped compound semiconductor active layer 512 is etched back to expose a surface of the third epitaxial barrier layer 640 according to aspects of the present disclosure. A first space defining the etched portion of the doped compound semiconductor active layers 512a and 512b is between the ohmic contacts 630a and 630b. For example, the remaining un-etched portions are, respectively, a source 512a and a drain 512b of the compound semiconductor field effect transistor 700. The doped compound semiconductor active layer 512 is etched to the third epitaxial barrier layer 640 with the etching going through the fourth etch stop layer 534d or through at least a portion of the fourth etch stop layer 534d. For example, the doped compound semiconductor active layer 512 is etched with a first chemical such that the etching stops on the fourth etch stop layer 534d. Subsequently, the fourth etch stop layer 534d is etched with a different chemical (e.g., citric acid) such that the etching stops at the third epitaxial barrier layer 640. A thickness of the etch of the doped compound semiconductor active layer 512 and the fourth etch stop layer 534d is illustrated by a thickness 742 of the first space.

Figure 8:
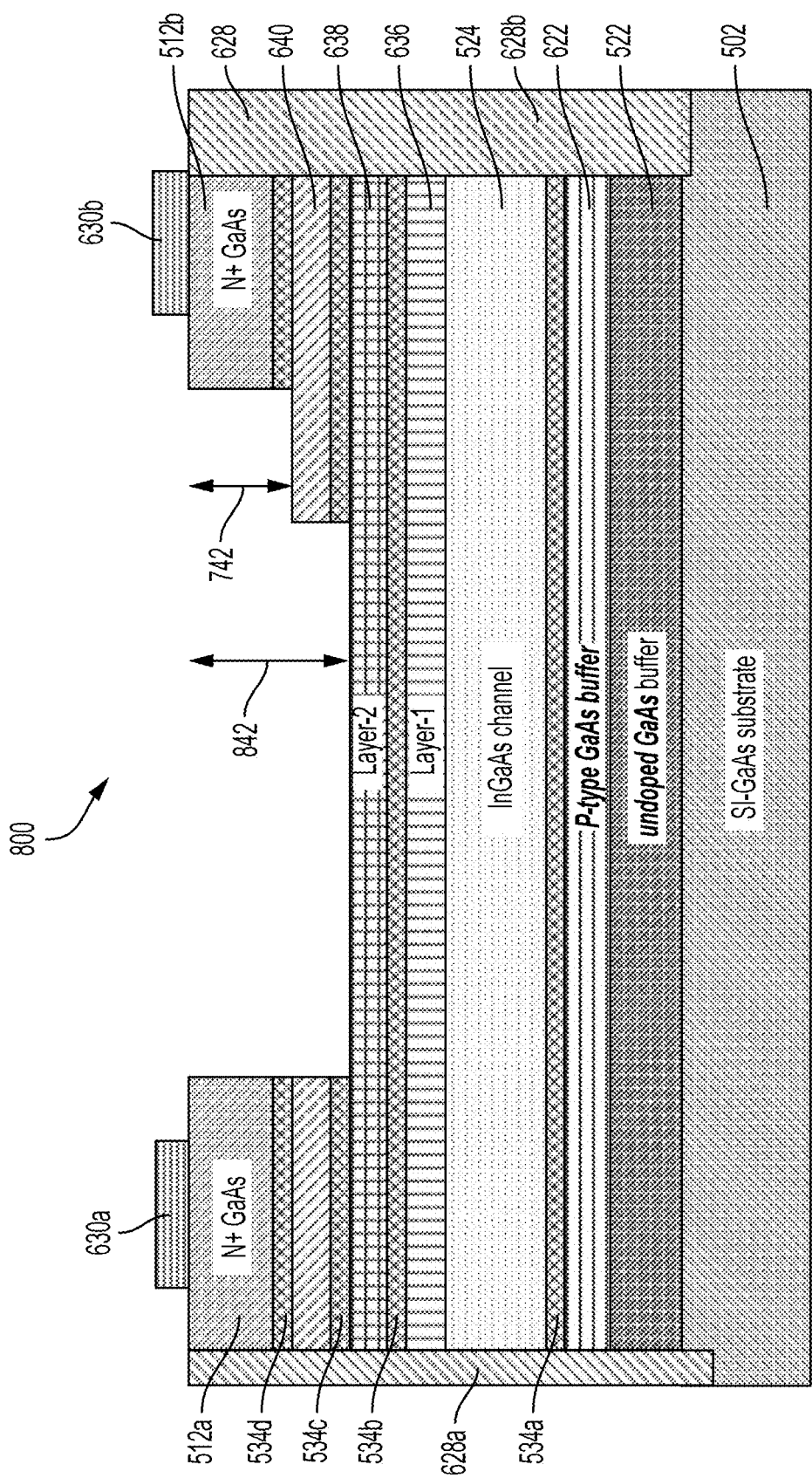

FIG. 8 illustrates a compound semiconductor field effect transistor 800 in which other layers of the multi-layer epitaxial barrier layer are asymmetrically etched according to aspects of the present disclosure. For example, a portion of the third epitaxial barrier layer 640 is etched back to expose a surface of the second epitaxial barrier layer 638. A second space defining the etched portion of the third epitaxial barrier layer 640 is between the source 512a and the drain 512b.

In one aspect, the third epitaxial barrier layer 640 is first etched to a surface of the third etch stop layer 534c with a first chemical. Subsequently, the third etch stop layer 534c is etched with a different chemical (e.g., citric acid) such that the etching stops at the second epitaxial barrier layer 638. A thickness of the etch of the third epitaxial barrier layer 640 and the third etch stop layer 534c is illustrated by a thickness 842. In one aspect of the disclosure, the etching towards the drain 512b may be asymmetric while the etching toward the source may be symmetric. For example, the third epitaxial barrier layer 640 and the third etch stop layer 534c are etched such that the third epitaxial barrier layer 640 has more material closer to the drain 512b than the source 512a to create an asymmetric structure.

Figure 9:
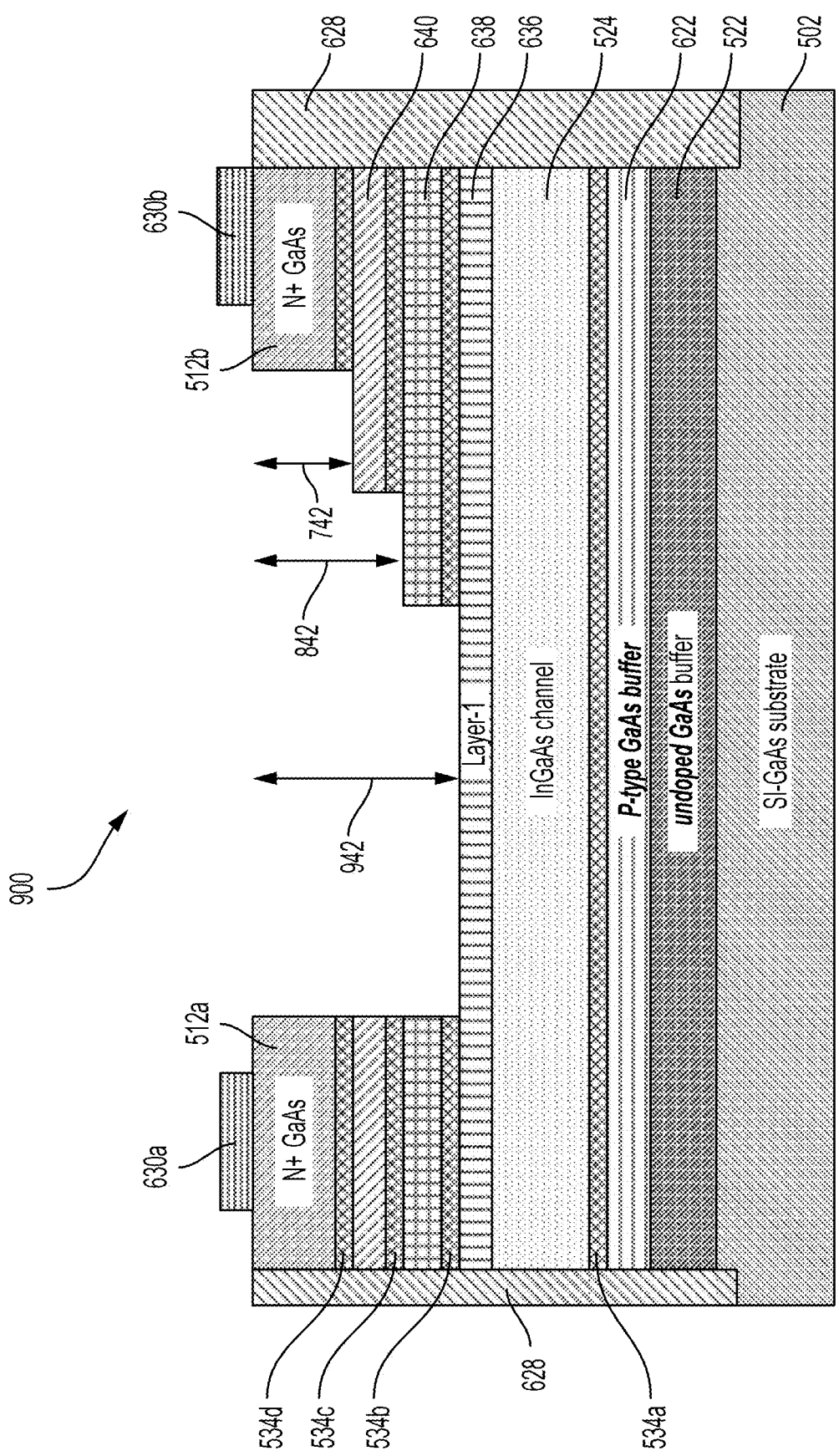

FIG. 9 illustrates a compound semiconductor field effect transistor 900 in which additional layers of the multi-layer epitaxial barrier layer are asymmetrically etched according to aspects of the present disclosure. For example, a portion of the second epitaxial barrier layer 638 is etched back to expose a surface of the first epitaxial barrier layer 636. A third space defining the etched portion of the second epitaxial barrier layer 638 is between the source 512a and the drain 512b.

In one aspect, the second epitaxial barrier layer 638 is first etched to a surface of the second etch stop layer 534b with the first chemical. Subsequently, the second etch stop layer 534b is etched with a different chemical (e.g., citric acid) such that the etching stops at the first epitaxial barrier layer 636. A thickness of the etch of the second epitaxial barrier layer 638 and the second etch stop layer 534b is illustrated by a thickness 942. In one aspect of the disclosure the etching towards the drain 512b may be asymmetric while the etching toward the source may be symmetric. For example, the second epitaxial barrier layer 638 and the second etch stop layer 534b are etched such that the second epitaxial barrier layer 638 has more material closer to the drain 512b than the source 512a to create an asymmetric structure.

Figure 10:
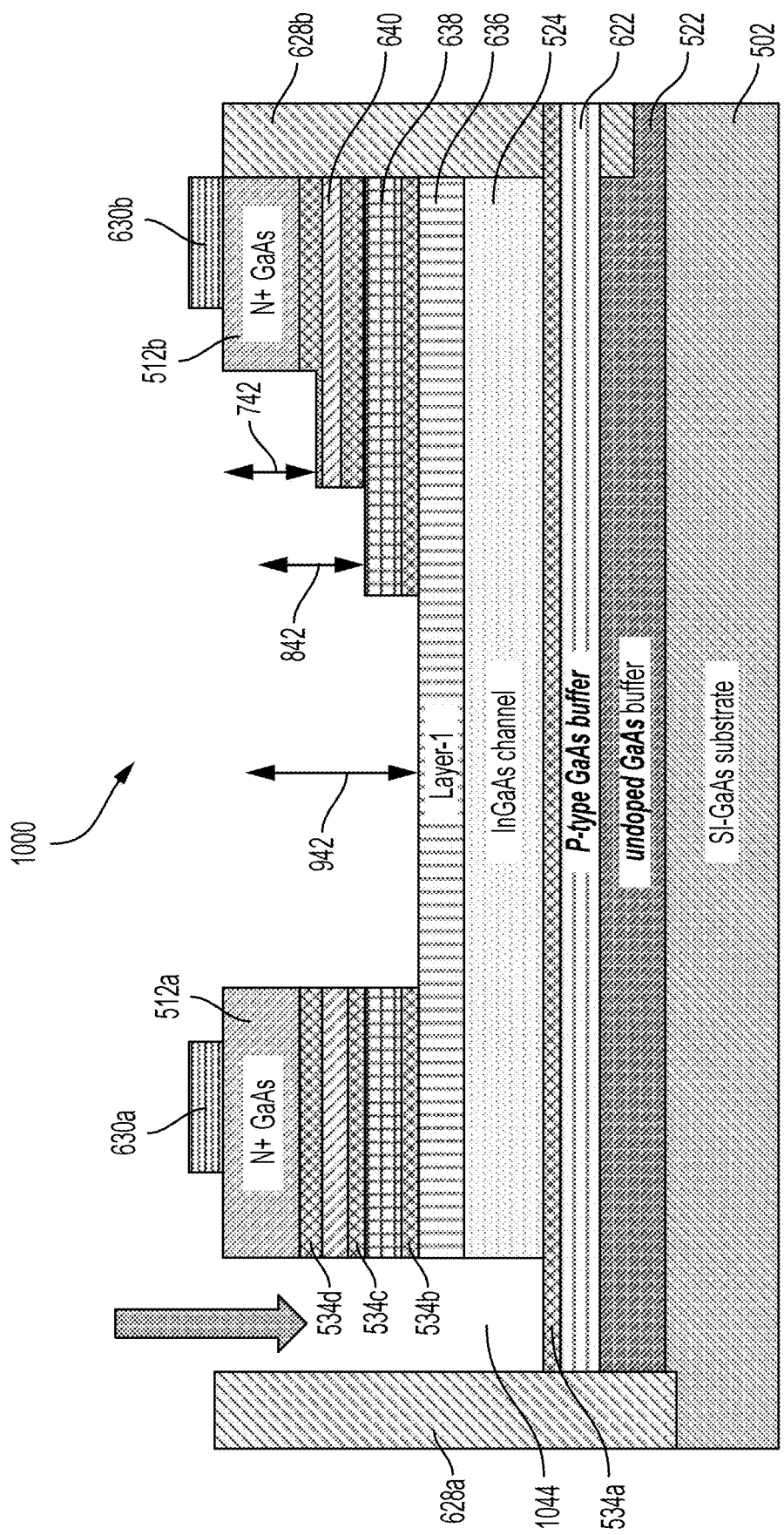

FIG. 10 illustrates a compound semiconductor field effect transistor 1000 in which a recess 1044 is created between the isolation layer 628a around a region of the source 512a according to aspects of the present disclosure. For example, the recess 1044 may be defined between the isolation layer 628a and sidewalls of the source 512a, the second etch stop layer 534b, the third etch stop layer 534c, the fourth etch stop layer 534d, the first epitaxial barrier layer 636, the second epitaxial barrier layer 638, the third epitaxial barrier layer 640, and the channel layer 524, as well as a surface of the first etch stop layer 534a.

Figure 11:
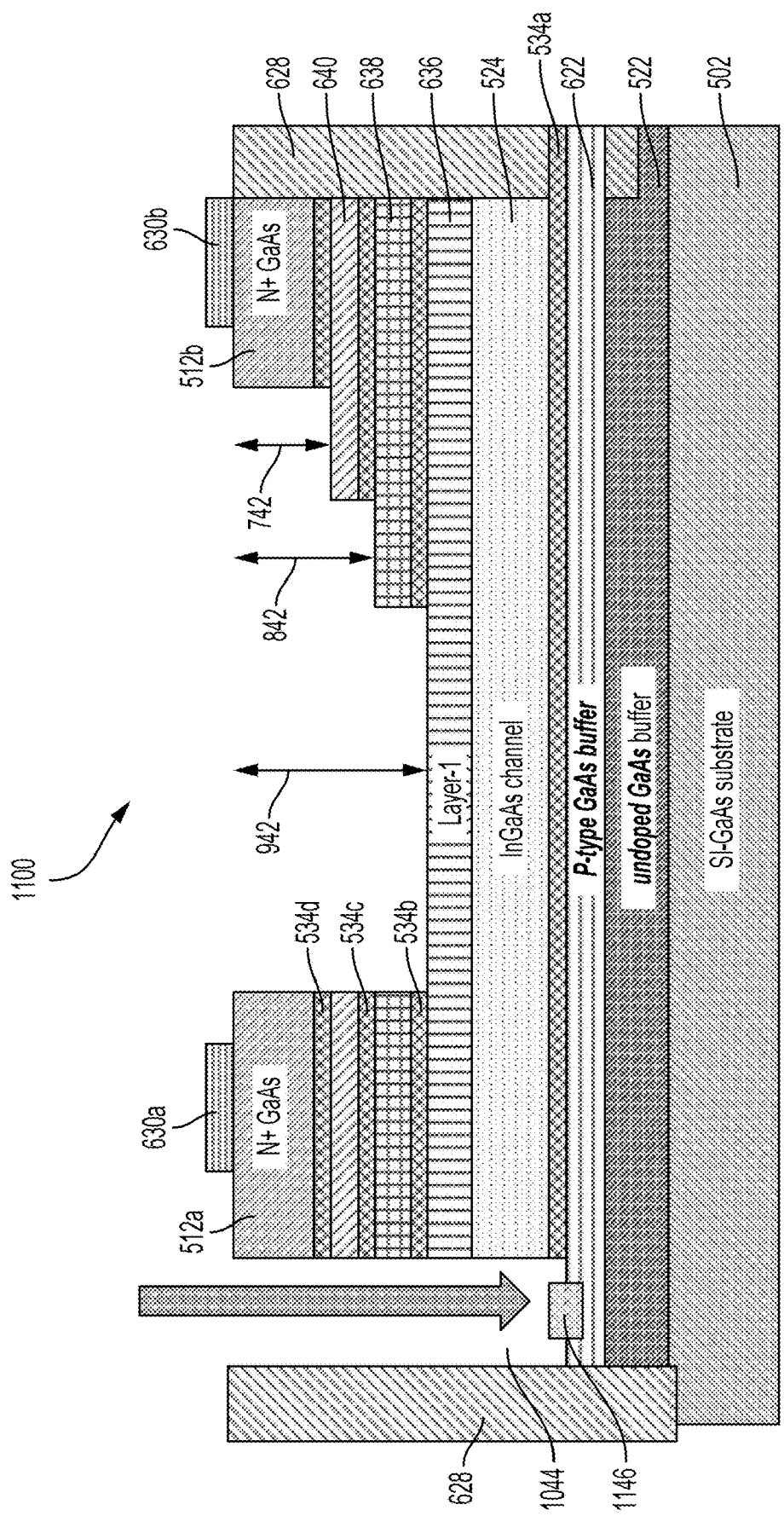

FIG. 11 illustrates a compound semiconductor field effect transistor 1100 in which the first etch stop layer 534a is etched to extend the recess 1044 to a surface of the doped buffer layer 622. A body contact 1146 is then formed on the surface of the doped buffer layer 622. The body contact may be a p-type ohmic contact.

Figure 12:
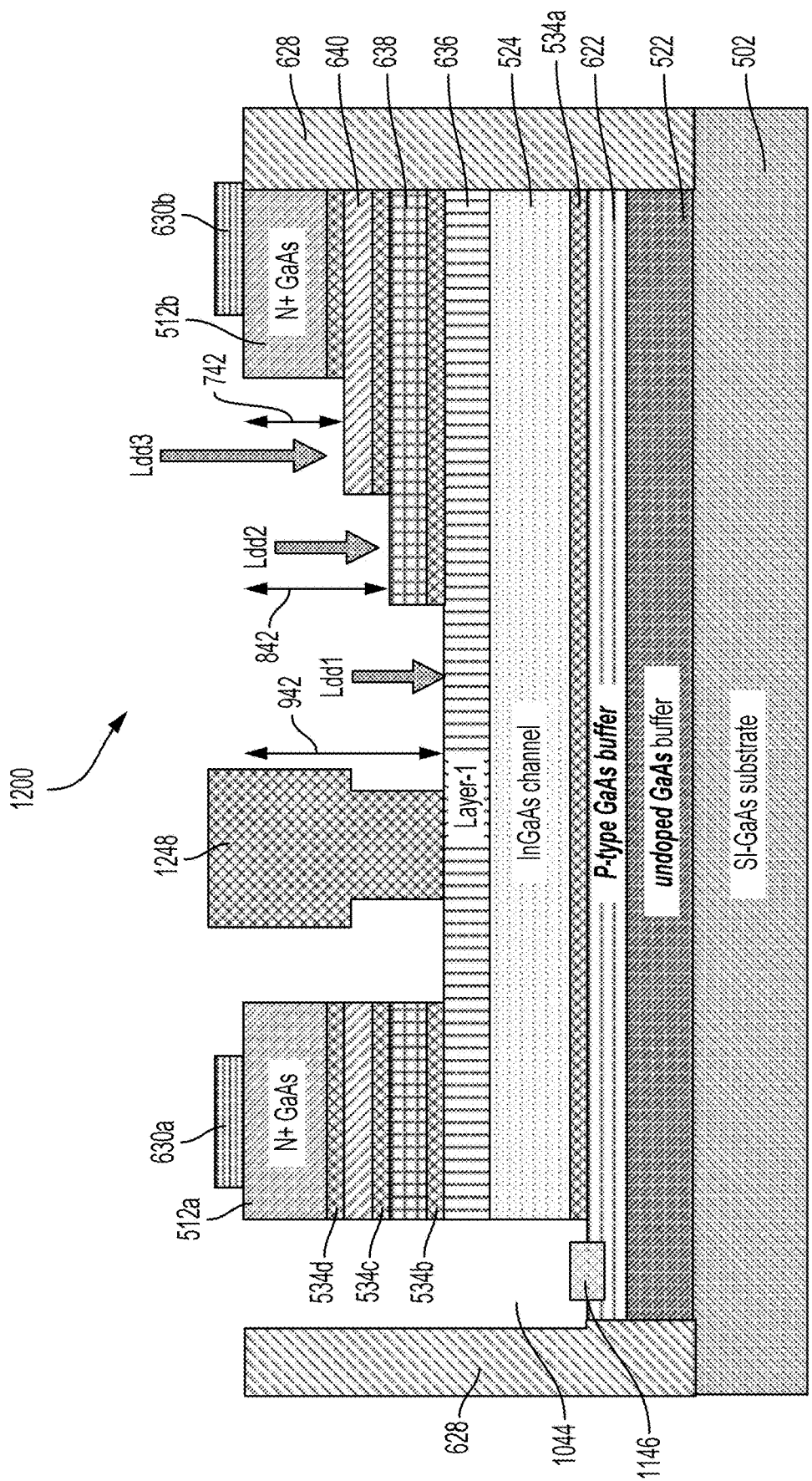

FIG. 12 illustrates a compound semiconductor field effect transistor 1200 in which a gate 1248 is formed on the first epitaxial barrier layer 636. The gate may be formed on the first epitaxial barrier layer 636 within the third space defined between portions of the second epitaxial barrier layer 638, portions of the third epitaxial barrier layer 640, and/or portions of the source 512a and the drain 512b. The gate 1248 may be a T gate formed by a two-step gate process. A thickness of the composite multi-layer epitaxial barrier layer increases in steps as a distance from the gate increases. A distance between the gate 1248 and a source 512a is less than a distance between the gate 1248 and the drain 512b. The first epitaxial barrier layer 636 forms a first low doped drain (Ldd1) with a first concentration of doping. The second epitaxial barrier layer 638 forms a second low doped drain (Ldd2) with a second concentration of doping. The third epitaxial barrier layer 640 forms a third low doped drain (Ldd3) with a third concentration of doping.

Figure 13:
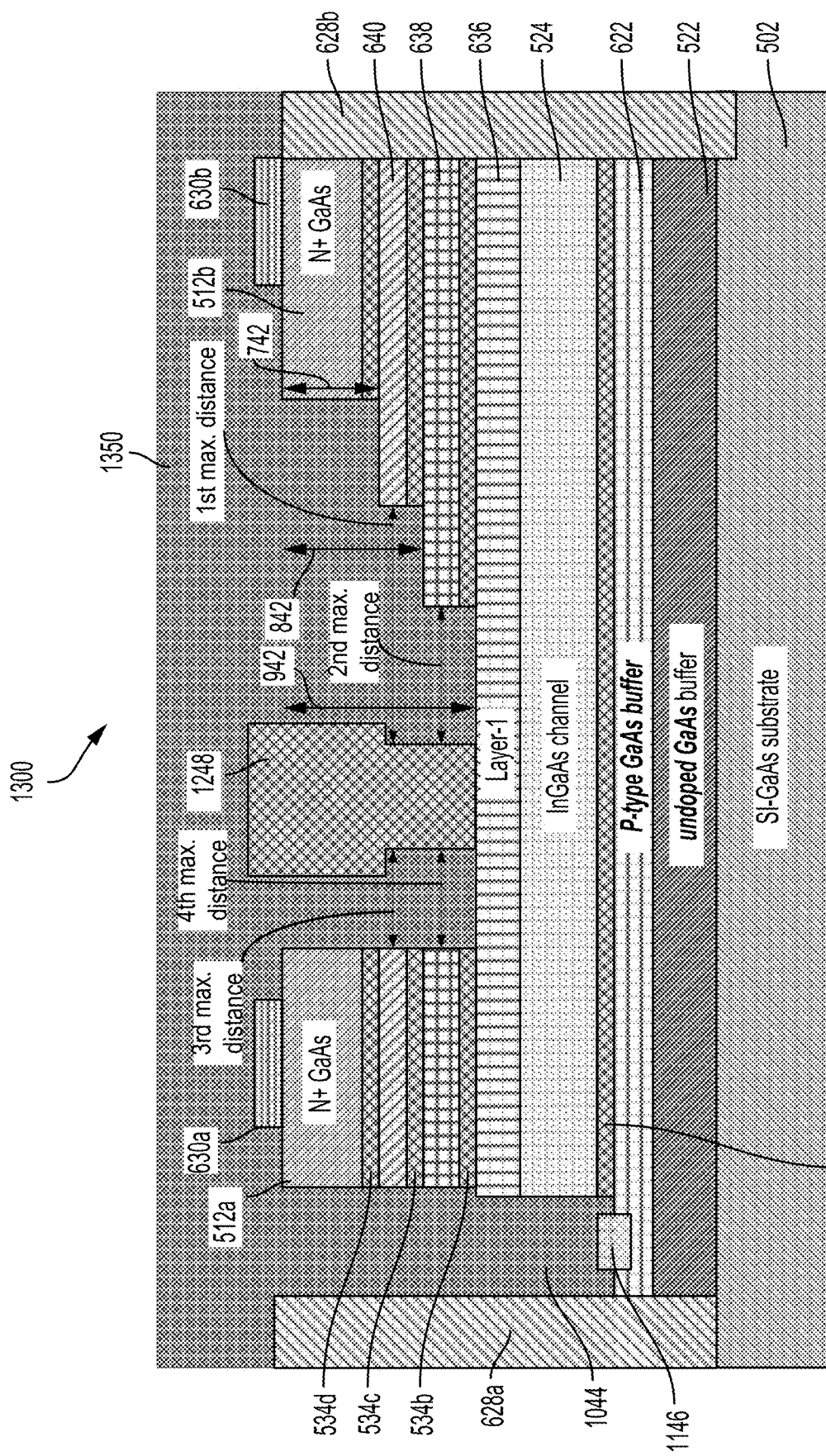

FIG. 13 illustrates a compound semiconductor field effect transistor 1300 in which a passivation layer 1350 is formed on exposed surfaces opposite the compound semiconductor substrate 502. For example the passivation layer 1350 is formed on exposed surfaces of the isolation layers 628a and 628b, the doped buffer layer 622, the body contact 1146, the ohmic contacts 630a and 630b, the source 512a, the drain 512b, the gate 1248, the first epitaxial barrier layer 636, the second epitaxial barrier layer 638 and the third epitaxial barrier layer 640.

Figure 14:
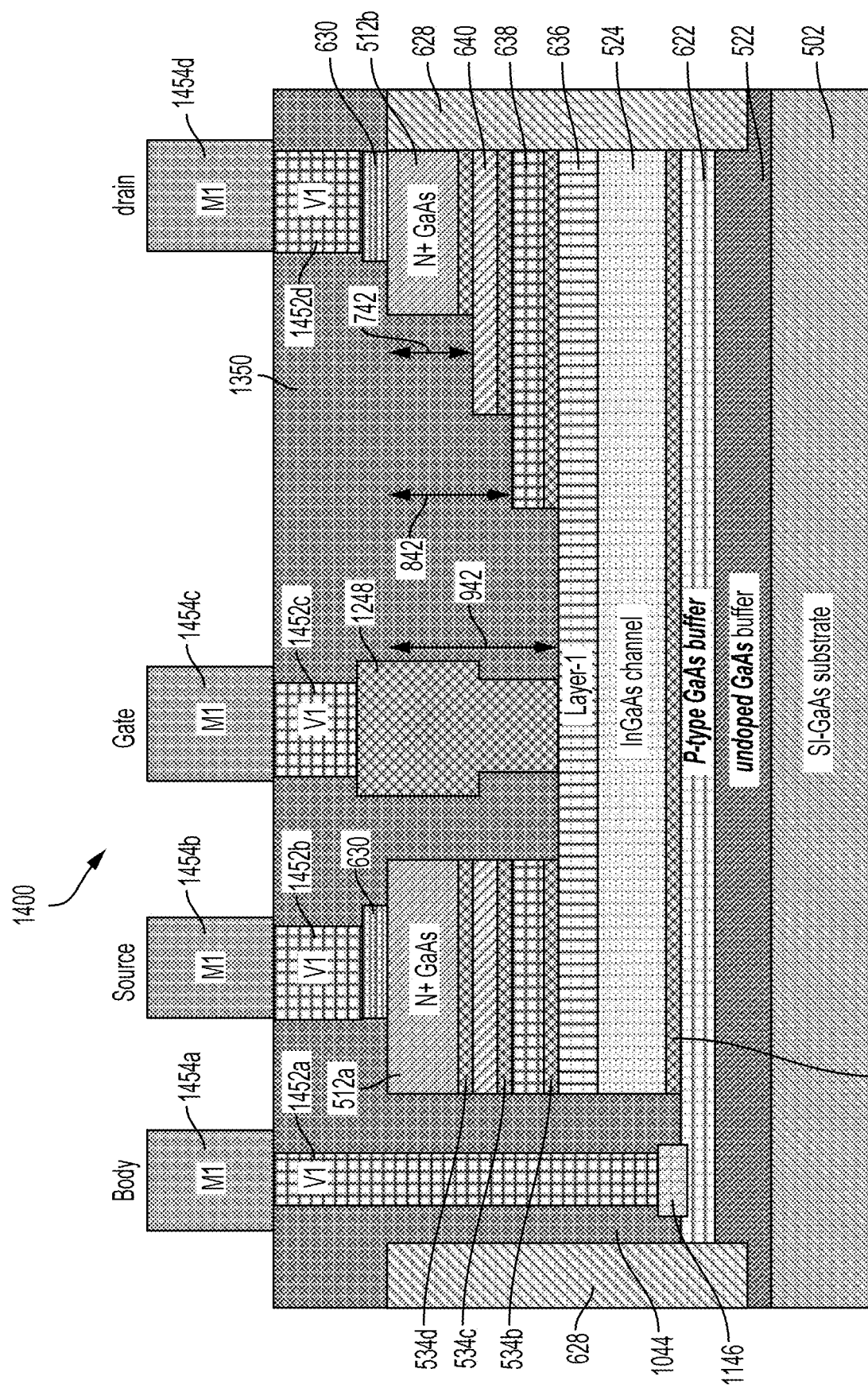

FIG. 14 illustrates a compound semiconductor field effect transistor 1400 including interconnects and vias to connect the drain, gate, source and body contact to external circuits or devices. For example, the compound semiconductor field effect transistor 1400 includes a first via 1452a that connects or couples the body contact 1146 to a first interconnect 1454a and a second via 1452b that connects or couples the source 512a to a second interconnect 1454b. The body contact provides a ground path for holes, so that holes can be collected effectively without causing body potential increase, thus to avoid lowering breakdown voltage. The compound semiconductor field effect transistor 1400 also includes a third via 1452c that connects or couples the gate 1248 to a third interconnect 1454c and a fourth via 1452d that connects or couples the drain 512b to a fourth interconnect 1454d. The compound semiconductor field effect transistor 1400 forms part of an integrated circuit. The compound semiconductor field effect transistor 1400 relies on the P-type doped buffer layer 622 to deplete electrons to make the low doped drains (e.g., first epitaxial barrier layer 636, a second epitaxial barrier layer 638 and a third epitaxial barrier layer 640) more resistive. A first epitaxial barrier layer 636, a second epitaxial barrier layer 638 and a third epitaxial barrier layer 640 all absorb some voltage based on their respective resistances.

Figure 15:
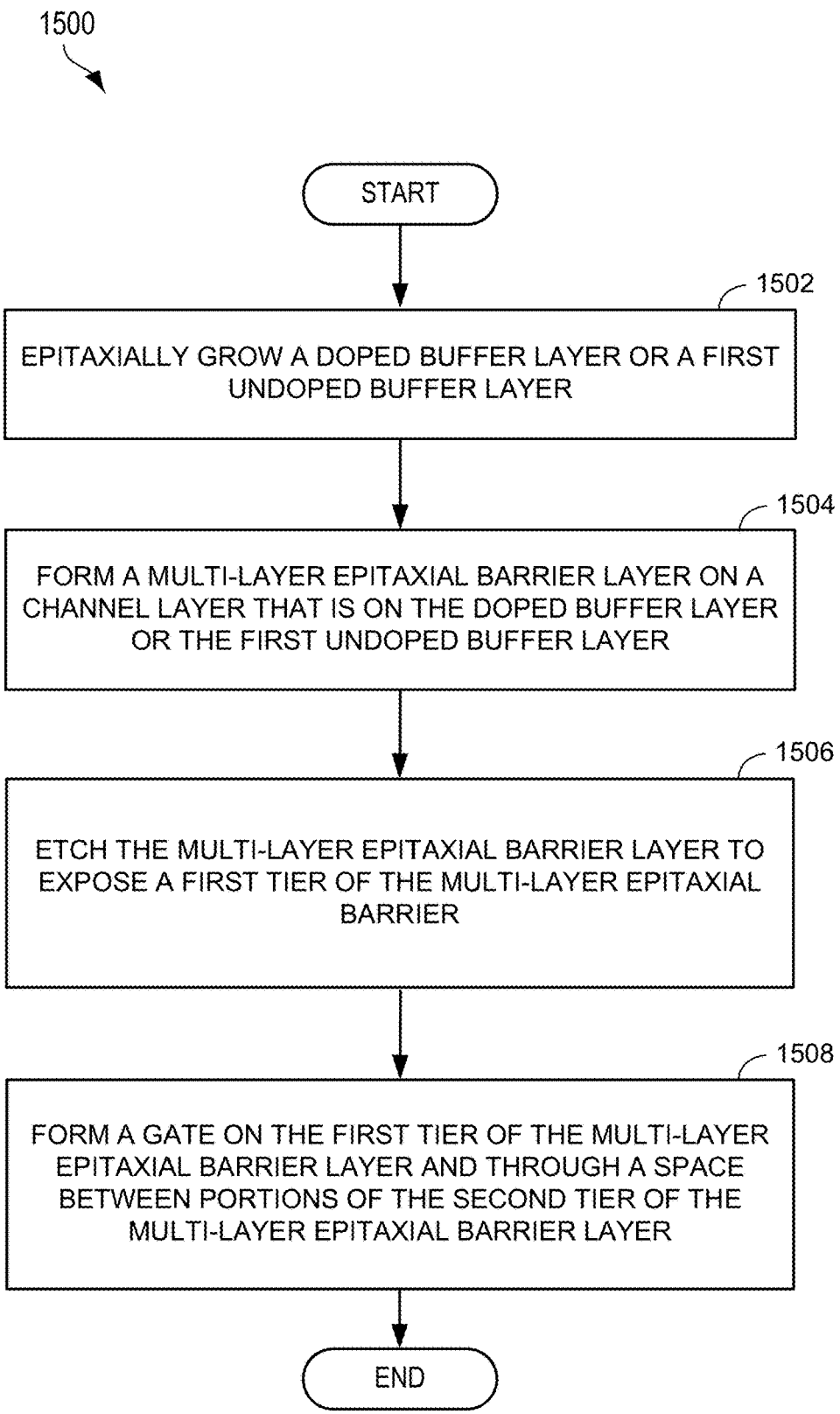
FIG. 15 is a flow diagram illustrating a method of making a compound semiconductor field effect transistor, in accordance with aspects of the present disclosure.

FIG. 15 is a flow diagram 1500 illustrating a method of making a compound semiconductor field effect transistor, in accordance with aspects of the present disclosure. The blocks in the flow diagram 1500 can be performed in or out of the order shown, and in some aspects, can be performed at least in part in parallel.

At block 1502, the method includes epitaxially growing a doped buffer layer or a first un-doped buffer layer. At block 1504 a multi-layer epitaxial barrier layer is formed on a channel layer. The channel layer may be on the doped buffer layer or on the first un-doped buffer layer. At block 1506 the multi-layer epitaxial barrier layer is etched to expose a first tier of the multi-layer epitaxial barrier layer. At block 1508 a gate is formed on the first tier of the multi-layer epitaxial barrier layer, and through a space between portions of a second tier of the multi-layer epitaxial barrier layer. The use of the term "on" may refer to "directly on" in some examples, and may refer to "on" via other layers in other examples.

According to a further aspect of the present disclosure, a compound semiconductor field effect transistor is described. The compound semiconductor field effect transistor may include means for isolating a channel layer from active layers of the compound semiconductor field effect transistors. The isolating means may, for example, be a multi-layer epitaxial barrier layer that includes a first epitaxial barrier layer 636, a second epitaxial barrier layer 638, and a third epitaxial barrier layer 640, as shown in FIGS. 6-14. In another aspect, the aforementioned means may be any layer, module, or any apparatus configured to perform the functions recited by the aforementioned means.

Figure 16:
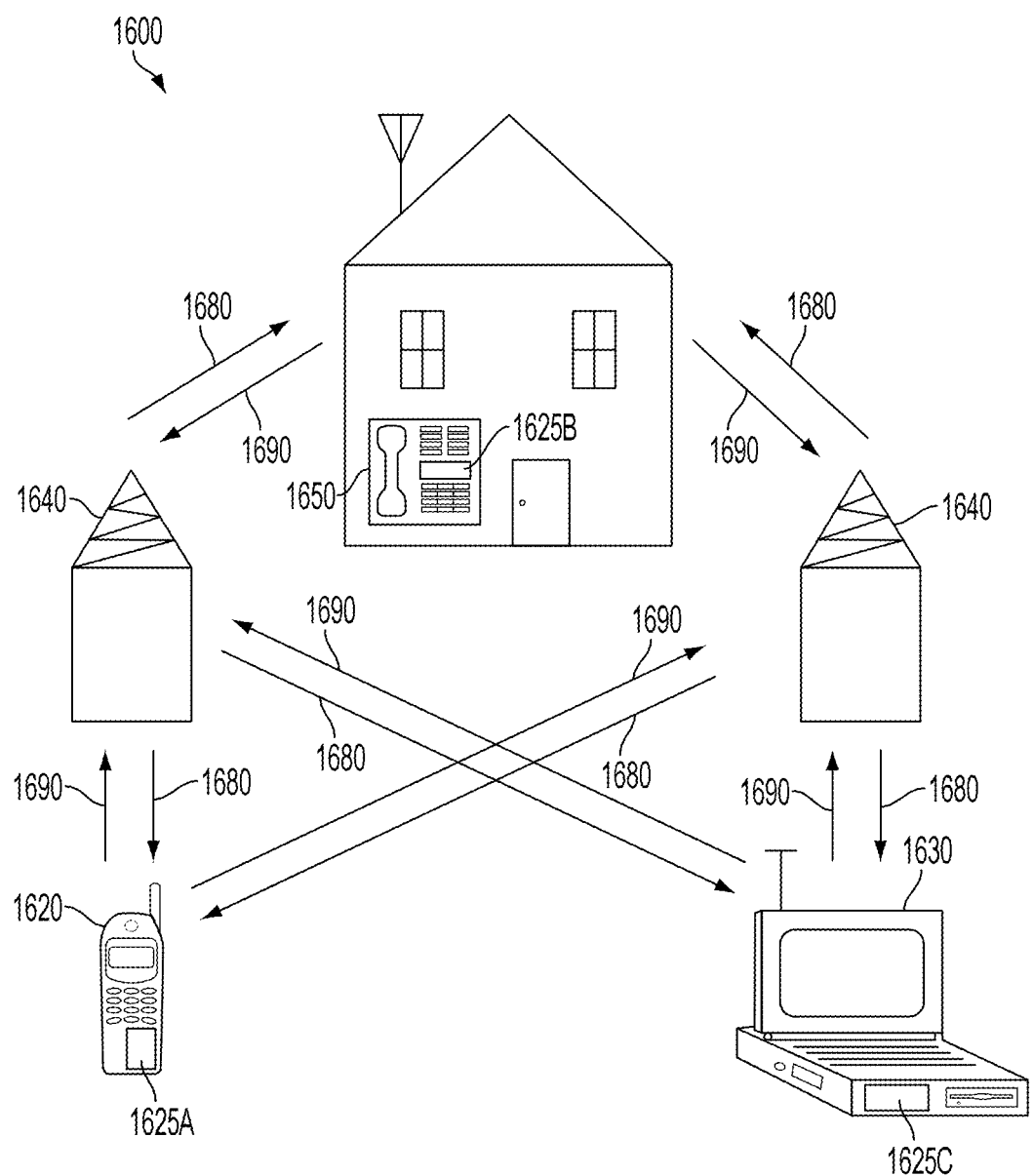
FIG. 16 is a block diagram showing an exemplary wireless communication system in which an aspect of the disclosure may be advantageously employed.

FIG. 16 is a block diagram showing an exemplary wireless communication system 1600 in which an aspect of the disclosure may be advantageously employed. For purposes of illustration, FIG. 16 shows three remote units 1620, 1630, and 1650 and two base stations 1640. It will be recognized that wireless communication systems may have many more remote units and base stations. Remote units 1620, 1630, and 1650 include IC devices 1625A, 1625C, and 1625B that include the disclosed compound semiconductor field effect transistor. It will be recognized that other devices may also include the disclosed compound semiconductor field effect transistor, such as the base stations, user equipment, and network equipment. FIG. 16 shows forward link signals 1680 from the base station 1640 to the remote units 1620, 1630, and 1650 and reverse link signals 1690 from the remote units 1620, 1630, and 1650 to base station 1640.

In FIG. 16, remote unit 1620 is shown as a mobile telephone, remote unit 1630 is shown as a portable computer, and remote unit 1650 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 16 illustrates remote units according to the aspects of the disclosure, the disclosure is not limited to these exemplary illustrated units. Aspects of the disclosure may be suitably employed in many devices, which include the disclosed compound semiconductor field effect transistor.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The apparatuses, methods, and systems disclosed herein may also be implemented digitally and differentially, among others. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described herein may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. For example, the apparatuses, methods, and systems described herein may be performed digitally and differentially, among others. Accordingly, the scope of the present disclosure is intended to be defined only by reference to the appended claims.

What is claimed is:

1. A compound semiconductor field effect transistor, comprising:
   a multi-layer epitaxial barrier layer on a channel layer, the channel layer coupled to a doped buffer layer; and
   a gate on a first tier of the multi-layer epitaxial barrier layer, and through a space between a second tier and a third tier of the multi-layer epitaxial barrier layer, a first distance from the gate to the third tier at a drain region is increased relative to a second distance from the gate to the second tier at the drain region, a third distance from the gate to a closest edge of the second tier at a source region is the same as a fourth distance from the gate to a closest edge of the third tier at the source region, the closest edge of the second tier colinear with the closest edge of the third tier.

2. The compound semiconductor field effect transistor of claim 1, further comprising a body contact electrically coupled to the doped buffer layer.

3. The compound semiconductor field effect transistor of claim 1, in which the doped buffer layer comprises a P-type doped buffer layer.

4. The compound semiconductor field effect transistor of claim 1, further comprising an etch stop layer on the doped buffer layer.

5. The compound semiconductor field effect transistor of claim 1, in which a first thickness of the multi-layer epitaxial barrier layer with respect to the third tier is increased relative to a second thickness of the multi-layer epitaxial barrier layer with respect to the second tier.

6. The compound semiconductor field effect transistor of claim 1, in which the third distance between the gate and the source region is less than the second distance between the gate and the drain region.

7. The compound semiconductor field effect transistor of claim 1, in which the multi-layer epitaxial barrier layer comprises an etch stop layer between the first tier and the second tier, and between the second tier and the third tier.

8. The compound semiconductor field effect transistor of claim 1, in which the compound semiconductor field effect transistor comprises a high-electron-mobility transistor (HEMT) or a pseudomorphic high-electron-mobility transistor (pHEMT).

9. The compound semiconductor field effect transistor of claim 1, in which the doped buffer layer is on an un-doped buffer layer.

10. The compound semiconductor field effect transistor of claim 1, in which the compound semiconductor field effect transistor is integrated into a power amplifier.

11. The compound semiconductor field effect transistor of claim 10, in which the power amplifier is incorporated into at least one of a music player, a video player, an entertainment unit, a navigation device, a communications device, a personal digital assistant (PDA), a fixed location data unit, a mobile phone, and a portable computer.

12. A radio frequency (RF) front end module, comprising:
a chip, comprising a compound semiconductor field effect transistor, the compound semiconductor field effect transistor comprising a channel layer and a multi-layer epitaxial barrier layer, the multi-layer epitaxial barrier layer on the channel layer, the channel layer coupled to a doped buffer layer, and a gate on a first tier of the multi-layer epitaxial barrier layer, and through a space between a second tier and a third tier of the multi-layer epitaxial barrier layer, a first distance from the gate to the third tier at a drain region is increased relative to a second distance from the gate to the second tier at the drain region, a third distance from the gate to a closest edge of the second tier at a source region is the same as a fourth distance from the gate to a closest edge of the third tier at the source region, the closest edge of the second tier colinear with the closest edge of the third tier; and
an antenna coupled to an output of the chip.

13. The RF front end module of claim 12, in which the compound semiconductor field effect transistor comprises a body contact electrically coupled to the doped buffer layer.

14. The RF front end module of claim 12, in which the doped buffer layer comprises a P-type doped buffer layer.

15. The RF front end module of claim 12, further comprising an etch stop layer on the doped buffer layer.

16. The RF front end module of claim 12, in which a first thickness of the multi-layer epitaxial barrier layer with respect to the third tier is increased relative to a second thickness of the multi-layer epitaxial barrier layer with respect to the second tier.

17. The RF front end module of claim 12, in which the third distance between the gate and the source region is less than the second distance between the gate and the drain region.

18. The RF front end module of claim 12, in which the multi-layer epitaxial barrier layer comprises an etch stop layer between the first tier and the second tier, and between the second tier and the third tier.

19. The RF front end module of claim 12, in which the doped buffer layer is on an un-doped buffer layer.

20. A compound semiconductor field effect transistor, comprising:
means for isolating a channel layer from a source region and a drain region of the compound semiconductor field effect transistor, at least a portion of the means for isolating on the channel layer, the channel layer coupled to a doped buffer layer; and
a gate on a first tier of the means for isolating, and through a space between a second tier and a third tier of the means for isolating, a first distance from the gate to the third tier at the drain region is increased relative to a second distance from the gate to the second tier at the drain region, a third distance from the gate to a closest edge of the second tier at the source region is the same as a fourth distance from the gate to a closest edge of the third tier at the source region, the closest edge of the second tier colinear with the closest edge of the third tier.

21. The compound semiconductor field effect transistor of claim 20, further comprising a body contact electrically coupled to the doped buffer layer.

22. The compound semiconductor field effect transistor of claim 1, in which the first distance is a first end-to-end distance, the second distance is a second end-to-end distance, the third distance is a third end-to-end distance, and the fourth distance is a fourth end-to-end distance.

23. The RF front end module of claim 12, in which the first distance is a first end-to-end distance, the second distance is a second end-to-end distance, the third distance is a third end-to-end distance, and the fourth distance is a fourth end-to-end distance.

24. The compound semiconductor field effect transistor of claim 20, in which the first distance is a first end-to-end distance, the second distance is a second end-to-end distance, the third distance is a third end-to-end distance, and the fourth distance is a fourth end-to-end distance.

* * * * *